US011497149B2

(12) United States Patent
Jang et al.

(10) Patent No.: US 11,497,149 B2
(45) Date of Patent: Nov. 8, 2022

(54) DISPLAY DEVICE INCLUDING AN AIR GENERATOR

(71) Applicant: Samsung Display Co., LTD., Yongin-si (KR)

(72) Inventors: Dae Hwan Jang, Seoul (KR); Yi Joon Ahn, Seoul (KR); Seok Hyun Nam, Seoul (KR); Haeng Won Park, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/222,356

(22) Filed: Apr. 5, 2021

(65) Prior Publication Data

US 2021/0392796 A1 Dec. 16, 2021

(30) Foreign Application Priority Data

Jun. 12, 2020 (KR) .................. 10-2020-0071437

(51) Int. Cl.
*H05K 7/20* (2006.01)
*F28D 7/16* (2006.01)
*H01L 51/52* (2006.01)
*H01L 27/32* (2006.01)

(52) U.S. Cl.
CPC ....... *H05K 7/20972* (2013.01); *F28D 7/1692* (2013.01); *H01L 51/529* (2013.01); *H01L 51/5237* (2013.01); *H01L 27/3244* (2013.01)

(58) Field of Classification Search
CPC .... H05K 7/20954–2099; H01L 51/529; H01L 51/5237; H01L 27/3244; F28D 7/1692
See application file for complete search history.

(56) References Cited

U.S. PATENT DOCUMENTS

| 9,456,525 | B2 * | 9/2016 | Yoon | H05K 7/20972 |
| 11,044,840 | B2 * | 6/2021 | Kang | H05K 7/20209 |
| 11,159,891 | B2 * | 10/2021 | Kim | H04R 7/16 |
| 2010/0065260 | A1 * | 3/2010 | Sakamoto | H02K 7/06 |
| | | | | 417/321 |

FOREIGN PATENT DOCUMENTS

KR 10-2006-0089031 8/2006

\* cited by examiner

*Primary Examiner* — Zachary Pape
(74) *Attorney, Agent, or Firm* — Kile Park Reed & Houtteman PLLC

(57) ABSTRACT

A display device includes a first heat dissipation member disposed on a display panel, and an air generator disposed on the first heat dissipation member, wherein the air generator includes an air blower, and an air flow path disposed at a side of the air blower and extending in a first direction. The air blower includes a body defining an inner space of the air blower, a first diaphragm and a second diaphragm disposed in the inner space of the body and facing each other, a first magnet disposed on a surface of the first diaphragm, and a second magnet disposed on a surface of the second diaphragm, and an air discharge hole of the body disposed between the first diaphragm and the second diaphragm, the air discharge hole opened toward the air path, and at least one of the first magnet and the second magnet is an electromagnet.

19 Claims, 13 Drawing Sheets

DISPLAY DEVICE INCLUDING AN AIR GENERATOR

CROSS-REFERENCE TO RELATED APPLICATION(S)

This application claims priority to and benefits of Korean Patent Application No. 10-2020-0071437 under 35 U.S.C. § 119, filed in the Korean Intellectual Property Office on Jun. 12, 2020, the entire contents of which are incorporated herein by reference.

BACKGROUND

1. Technical Field

The disclosure relates to a display device.

2. Description of the Related Art

The importance of a display device has increased with the development of multimedia. Accordingly, various types of display devices such as an organic light emitting display (OLED) and a liquid crystal display (LCD) have been used.

Among display devices, a self-light emitting display device may include a self-light emitting element, for example, an organic light emitting element. The self-light emitting element may include two electrodes facing each other and a light emitting layer interposed therebetween. In case that the self-light emitting element is an organic light emitting element, electrons and holes provided from the two electrodes may be recombined in the light emitting layer to generate excitons, and the excitons may be changed from an excited state to a ground state to emit light.

Light sources may generate a large amount of heat in conjunction with generating light. In particular, as light having high luminance may be generated, a larger amount of heat may be generated. Accordingly, in order for the display device to operate properly, it may be necessary to effectively dissipate such heat.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An aspect of the disclosure may be to provide a display device having improved heat dissipation characteristics.

However, aspects are not restricted to the one set forth herein. The above and other aspects will become more apparent to one of ordinary skill in the art to which the disclosure pertains by referencing the detailed description given below.

An embodiment of a display device may include a first heat dissipation member disposed on a lower surface of a display panel, and an air generator disposed on a lower surface of the first heat dissipation member. The air generator may include an air blower, and an air flow path disposed at a side of the air blower and extending in a first direction. The air blower may include a body defining an inner space of the air blower, a first diaphragm and a second diaphragm disposed in the inner space of the body, the first diaphragm and the second diaphragm facing each other, a first magnet disposed on a surface of the first diaphragm, a second magnet disposed on a surface of the second diaphragm, and an air discharge hole of the body disposed between the first diaphragm and the second diaphragm, the air discharge hole opened toward the air path. At least one of the first magnet and the second magnet may be an electromagnet.

The air blower may be disposed in plurality, and the plurality of air blowers may be arranged in a second direction intersecting the first direction.

A surface of the first magnet and a surface of the second magnet may face each other.

A first magnet may be a permanent magnet, and the second magnet may be an electromagnet.

Alternating current power may be applied to the second magnet.

Attractive force and repulsive force may be periodically changed and applied between the first magnet and the second magnet.

The display device may further comprise a second heat dissipation member disposed on the lower surface of the first heat dissipation member.

A surface of the second heat dissipation member may include a nano-pattern.

The second heat dissipation member may have a thermal conductivity higher than a thermal conductivity of the first heat dissipation member.

The first heat dissipation member may include protrusion portions protruding toward an opposite side of the display panel, having a shape extending in the first direction, and arranged in a second direction intersecting the first direction.

The display device may further include a lower chassis providing a space that accommodates the display panel, the first heat dissipation member, and the air blower.

The lower chassis may include protrusion portions protruding toward the display panel, having a shape extending in the first direction, and arranged in a second direction intersecting the first direction.

The body may include an inner flow path, and the inner flow path may provide a passage for supplying air to the air blower from outside of the air blower.

The air discharge hole may include a first hole having a first width, and a second hole disposed at a side of the first hole in the first direction and having a second width smaller than the first width.

An embodiment of a display device may include a heat dissipation member disposed on a lower surface of a display panel, and an air generator disposed on a lower surface of the heat dissipation member. The air generator may include an air blower, and an air flow path disposed at a side of the air blower and extending in a first direction. The air blower may include a first magnet and a second magnet which face each other, a controller controlling attractive force and repulsive force of the first magnet and the second magnet, and an air discharge hole connecting a space between the first magnet and the second magnet to the air flow path.

A surface of the first magnet and a surface of the second magnet may be disposed to face each other.

The first magnet may be a permanent magnet, and the second magnet may be an electromagnet.

Alternating current power may be applied to the second magnet.

The heat dissipation member may include protrusion portions protruding toward an opposite side of the display panel, having a shape extending in the first direction, and arranged in a second direction intersecting the first direction.

The display device may further include a lower chassis providing a space that accommodates the display panel, the heat dissipation member, and the air blower. The lower chassis may include protrusion portions protruding toward the display panel, having a shape extending in the first direction, and arranged in a second direction intersecting the first direction.

BRIEF DESCRIPTION OF THE DRAWINGS

The above and other aspects and features of the invention will become more apparent by describing in detail example embodiments thereof with reference to the attached drawings, in which.

DETAILED DESCRIPTION OF THE EMBODIMENTS

Figure 1:
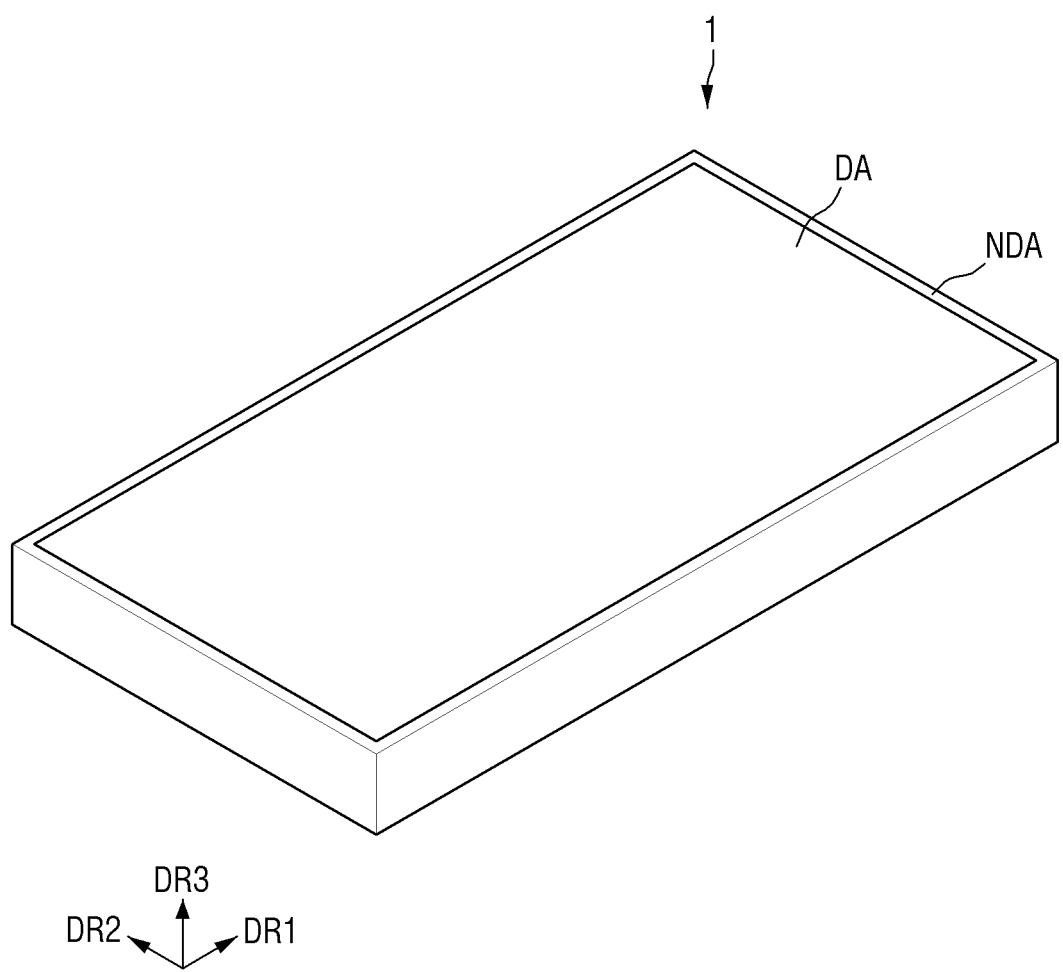
FIG. 1 is a schematic perspective view of a display device according to an embodiment.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms "a," "an," and "the" are intended to include the plural forms, including "at least one," unless the context clearly indicates otherwise.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will also be understood that when a layer is referred to as being "on" another layer or substrate, it can be directly on another layer or substrate, or intervening layers may also be present. In contrast, when an element is referred to as being "directly on" another element, there may be no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The same reference numbers indicate the same components throughout the specification.

The term "overlap" may include layer, stack, face or facing, extending over, extending under, covering or partly covering or any other suitable term as would be appreciated and understood by those of ordinary skill in the art.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
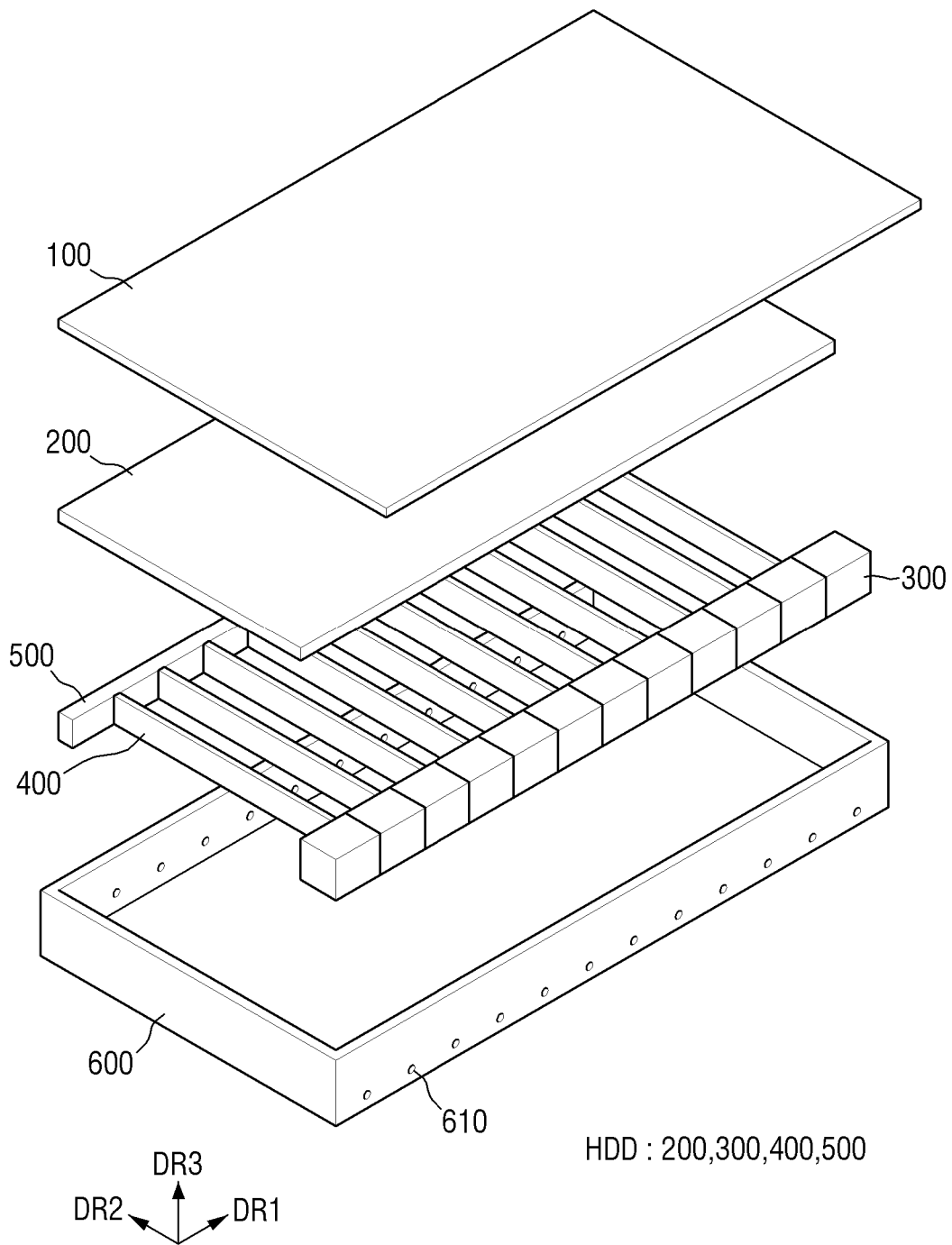
FIG. 2 is an exploded schematic perspective view of the display device of FIG. 1.
Figure 3:
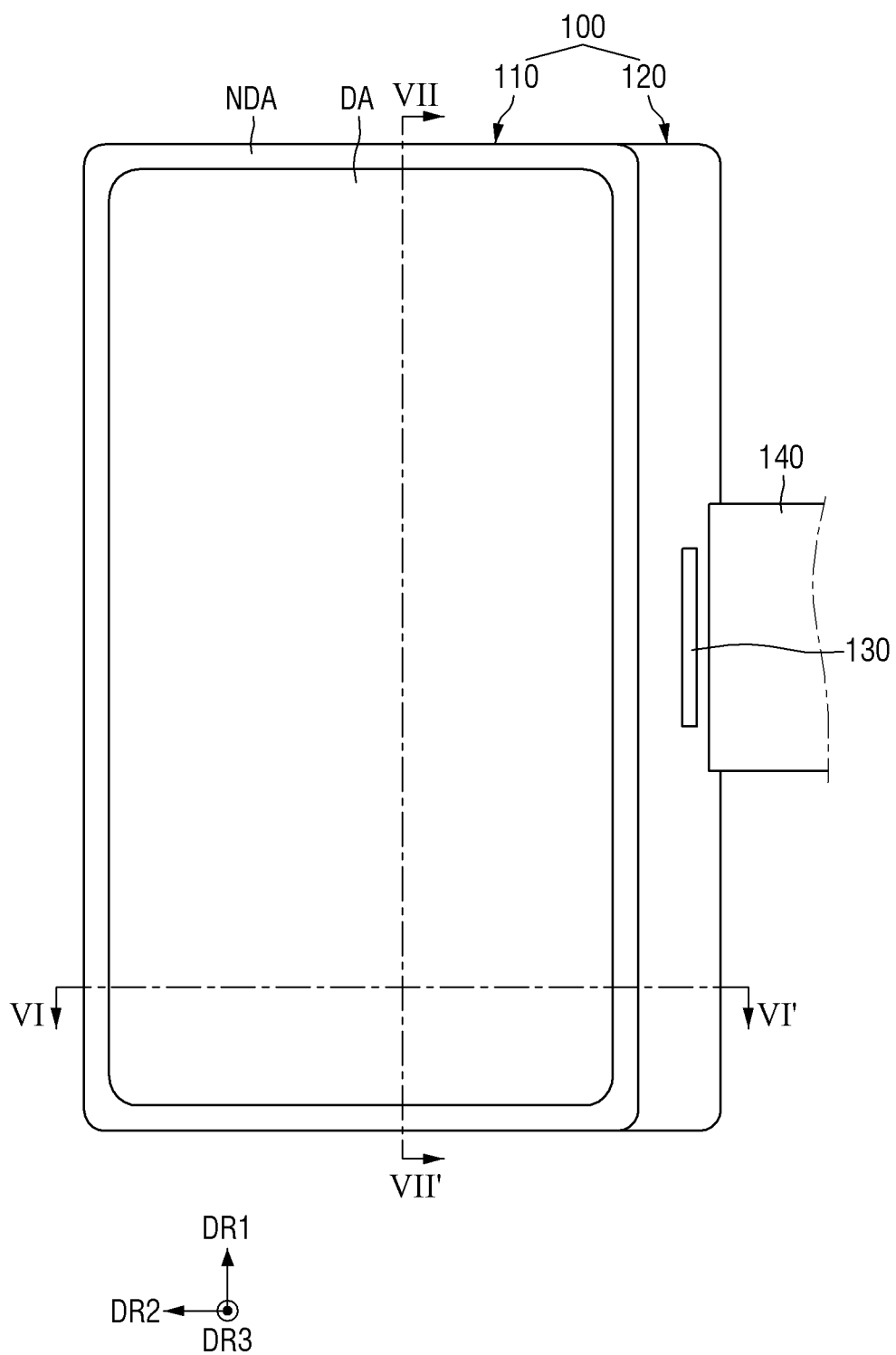
FIG. 3 is a schematic plan view of a display panel according to an embodiment.
Figure 4:
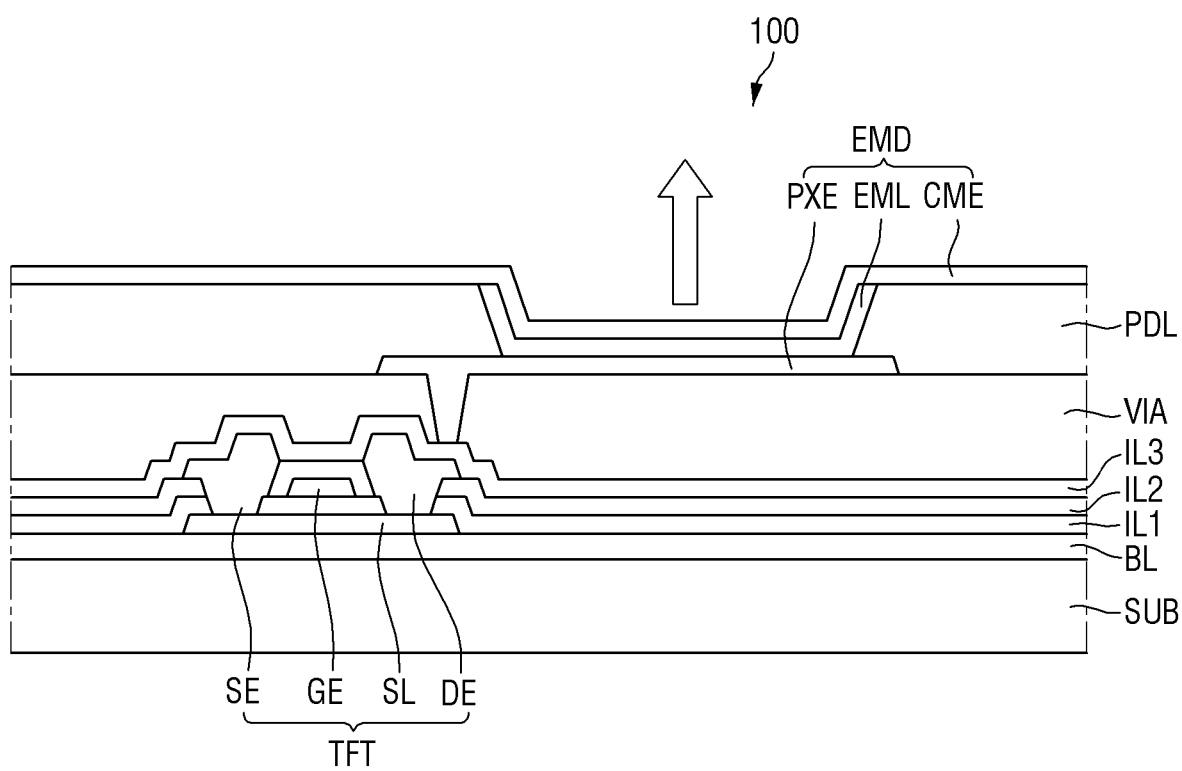
FIG. 4 is a schematic cross-sectional of a part of the display panel of FIG. 3.
Figure 5:
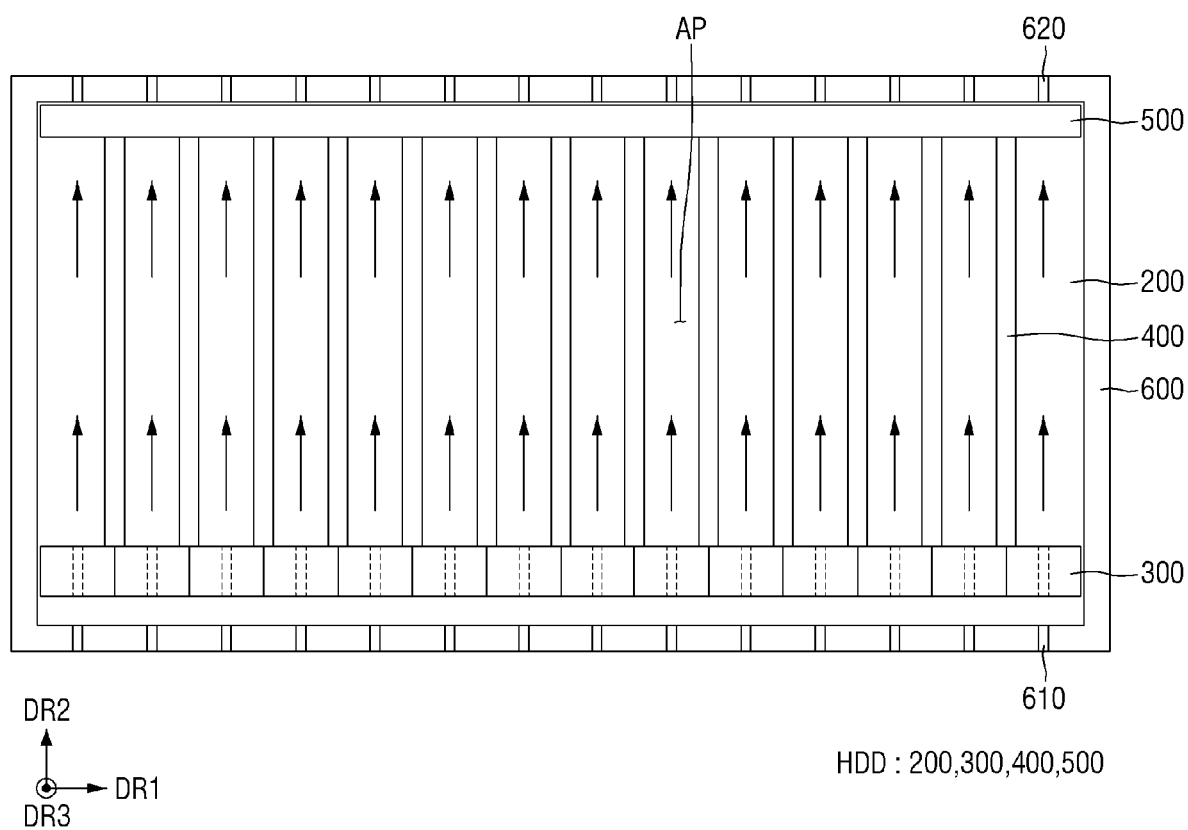
FIG. 5 is a schematic view of a display device according to an embodiment.
Figure 6:
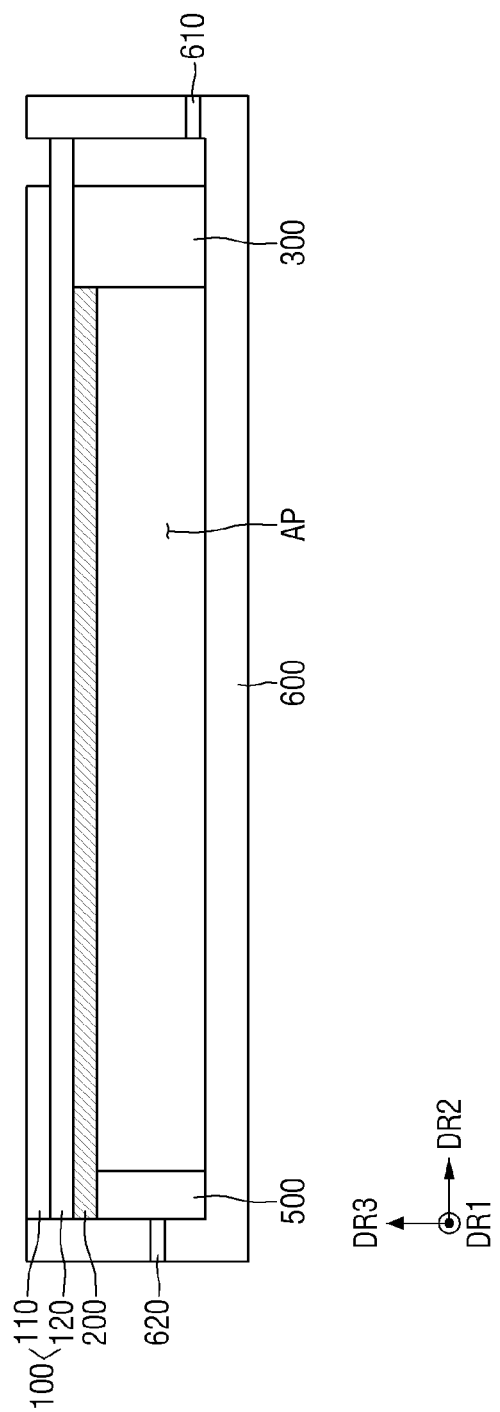
FIG. 6 is a schematic cross-sectional view of the display panel taken along line VI-VI' of FIG. 3.
Figure 7:
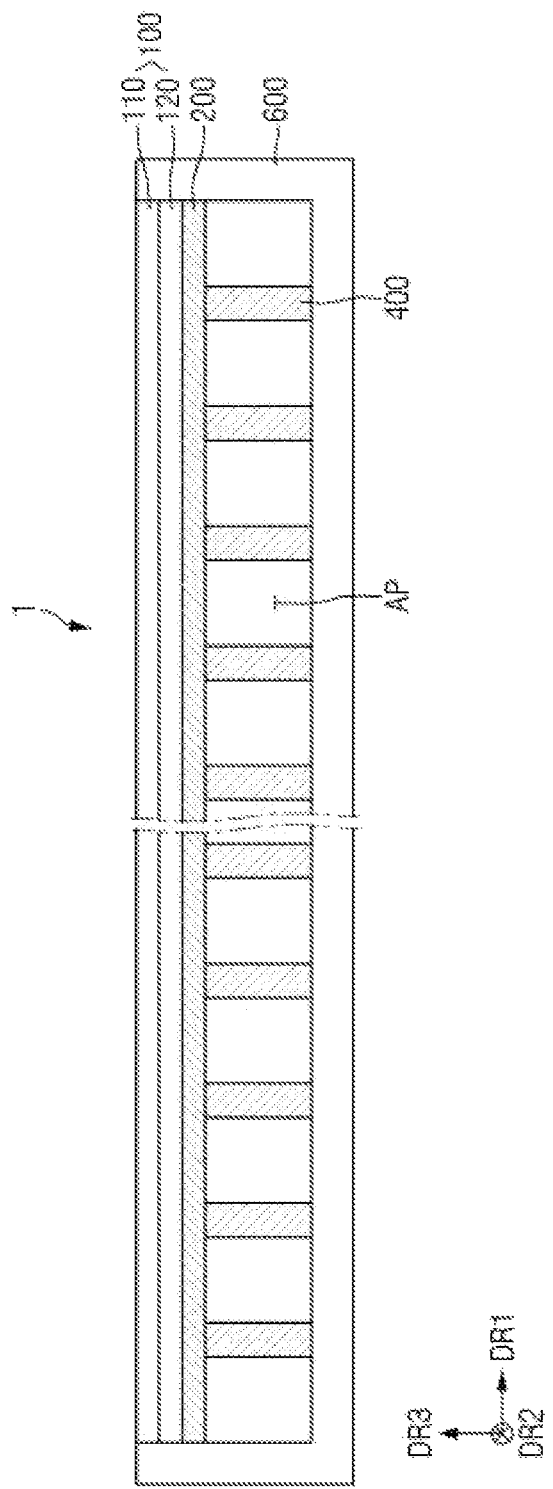
FIG. 7 is a schematic cross-sectional view of the display panel taken along line VII-VII' of FIG. 3.

FIG. 1 is a schematic perspective view of a display device according to an embodiment. FIG. 2 is an exploded schematic perspective view of the display device of FIG. 1. FIG. 3 is a schematic plan view of a display panel according to an embodiment. FIG. 4 is a schematic cross-sectional of a part of the display panel of FIG. 3. FIG. 5 is a schematic view of a display device according to an embodiment. FIG. 6 is a schematic cross-sectional view of the display panel taken along line VI-VI' of FIG. 3. FIG. 7 is a schematic cross-sectional view of the display panel taken along line VII-VII' of FIG. 3.

Referring to FIGS. 1 to 7, a display device 1 may refer to any electronic device that provides a display screen. Examples of the display device 1 may include televisions, notebook computers, monitors, billboards, mobile phones, smart phones, tablet personal computers (tablet PCs), smart watches, watch phones, mobile communication terminals, electronic notebooks, electronic books, portable multimedia players (PMPs), navigators, game machines, digital cameras, and internet of things (IOTs).

The display device 1 illustrated in the drawings may be a television. The display device 1 is not limited thereto, but may have high resolution to ultra-high resolution such as HD, UHD, 4K, and 8K.

The display device 1 may have a rectangular shape in a plan view. The planar shape of the display device 1 is not limited to that illustrated, and may have a circular shape or other shapes.

The display device 1 may include a display panel 100, a heat dissipation device HDD disposed under the display panel 100, and a lower chassis 600 protecting the lower portion of the display device 1. The heat dissipation device HDD may include a heat dissipation member 200, and an air blower 300, a flow path pattern 400, and a porous member 500, which may be disposed under the heat dissipation member 200.

The display panel 100 may be a light emitting display panel including a light emitting element. For example, the display panel 100 may be an organic light emitting display panel using an organic light emitting diode, a micro light emitting display panel using a micro light emitting diode (LED), or a quantum dot light emitting display panel including a quantum dot light emitting diode. In the following embodiments, a case where an organic light emitting display panel may be applied as the display panel 100 is illustrated, but the invention is not limited thereto. Different kinds of display panels such as a liquid crystal display (LCD) panel, a quantum dot organic light emitting display (QD-OLED) panel, a quantum dot liquid crystal display (QD-LCD) panel, or a micro LED panel may be applied.

The display panel 100 may include a display area DA that may display an image and a non-display area NDA that may not display an image. The display area DA may include pixels. The display area DA may have a rectangular shape having vertical corners or a rectangular shape having rounded corners in a plan view. The display area DA may have short sides and long sides. A long side of the display area DA may be a side extending in the first direction DR1. A short side of the display area DA may be a side extending in the second direction DR2. However, the planar shape of the display area DA is not limited to a rectangle, and may have a circular shape, an elliptical shape, or other various shapes. The non-display area NDA may be disposed adjacent to both short sides and long sides of the display area DA. The non-display area NDA may surround all sides of the display area DA and may form a frame of the display area DA. However, the invention is not limited thereto, and the non-display area NDA may be disposed adjacent to only both short sides or both long sides of the display area DA, or one side or three sides of the display area.

The display panel 100 may include a lower panel 120 and an upper panel 110 disposed on the lower panel 120.

The driving chip 130 may be disposed on the non-display area NDA of the display panel 100. The driving chip 130 may include an integrated circuit that drives the display panel 100. In an embodiment, the integrated circuit may be a data driving integrated circuit that generates and provides a data signal, but is not limited thereto. The driving chip 130 may be mounted on a surface of the lower panel 120 which may be a same surface as a surface of the display surface. The driving chip 130 may be attached onto the display panel 100 through an anisotropic conductive film, or may be attached onto the display panel 100 through ultrasonic bonding.

Although it is illustrated in FIG. 3 that the driving chip 130 may be disposed in a chip-on-glass (COG) method in which the driving chip 130 may be disposed on (e.g., directly disposed on) the lower panel 120, the invention is not limited thereto. The driving chip 130 may be disposed in a chip-on-film (COF) method in which the driving chip 130 may be mounted on a film and the film may be attached to the display panel 100. In another embodiment, the display panel 100 may include a flexible substrate including a flexible polymer material such as polyimide. Thus, the display panel 100 may be warped, bent, folded, or rolled, and the driving chip 130 may be disposed on (e.g., disposed directly on) the flexible display panel 100.

A printed circuit board 140 may be extended to the end of the non-display area NDA of the display panel 100. The printed circuit board 140 may be a flexible printed circuit board or film. The printed circuit board 140 may provide a signal for driving the display panel 100. Further, as will be described later, the printed circuit board 140 may provide power (e.g., an AC power) to a coil electrode 342 (refer to FIG. 10).

The display panel 100 may include a base substrate SUB. The base substrate SUB may be an insulating substrate. The base substrate SUB may include a transparent material. For example, the base substrate SUB may include a transparent insulating material such as glass, quartz, or a combination thereof. The base substrate SUB may be a rigid substrate. However, the base substrate SUB is not limited thereto, and may include plastic such as polyimide, and may have flexible characteristics capable of warping, bending, folding, or rolling.

A buffer layer BL may be disposed on the base substrate SUB. The buffer layer BL may be disposed on a surface of the base substrate SUB to protect a thin film transistor TFT and a light emitting element EMD from moisture penetrating through the base substrate SUB which may be vulnerable to moisture permeation. The buffer layer BL may be formed of multiple alternately stacked inorganic films. The buffer layer BL may be omitted.

A thin film transistor TFT may be disposed on the buffer layer BL as a driving element. The thin film transistor TFT may include a semiconductor layer SL, a first insulating layer IL1 a second insulating layer IL2, and a gate electrode GE.

The semiconductor layer SL of the thin film transistor TFT may be disposed on the buffer layer BL. The semiconductor layer SL may include polycrystalline silicon, monocrystalline silicon, low-temperature polycrystalline silicon, amorphous silicon, oxide semiconductor, or a combination thereof. A light blocking layer for blocking external light incident on the semiconductor layer SL may be formed between the buffer layer BL and the semiconductor layer SL.

The first insulating layer IL1 may be disposed on the semiconductor layer SL. The first insulating layer IL1 may be formed of an inorganic film.

The gate electrode GE may be disposed on the first insulating layer IL1 The gate electrode GE may overlap the semiconductor layer SL. The gate electrode GE may be formed as a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The second insulating layer IL2 may be disposed on the gate electrode GE. The second insulating layer IL2 may be formed of an inorganic film.

A source electrode SE (or drain electrode) and a drain electrode DE (or source electrode) of the thin film transistor TFT may be disposed on the second insulating layer IL2. The source electrode SE and the drain electrode DE may be electrically connected to the semiconductor layer SL through a contact hole penetrating the second insulating layer IL2 and the first insulating layer IL1 Each of the source electrode SE and the drain electrode DE may be formed as a single layer or multiple layers including a low-resistance material, for example, any one of aluminum (Al), gold (Au), and copper (Cu), or an alloy thereof.

A third insulating layer IL3 may be disposed on the source electrode SE and the drain electrode DE. The third insulating layer IL3 may be a passivation film protecting the underlying thin film transistor TFT. The third insulating layer IL3 may be formed of an inorganic film.

A via layer VIA may be disposed on the third insulating layer IL3. The via layer VIA may be a planarization film for flattening a step due to the thin film transistor TFT. The via layer VIA may include an organic insulating material.

A light emitting element EMD may be disposed on the via layer VIA. The light emitting element EMD may include a pixel electrode PXE, a light emitting layer EML, and a common electrode CME.

Specifically, the pixel electrode PXE may be disposed on the via layer VIA. The pixel electrode PXE may be a first electrode of the light emitting element EMD, for example, an anode electrode. The pixel electrode PXE may be electrically connected to the drain electrode DE (or source electrode SE) of the thin film transistor TFT through a contact hole penetrating the via layer VIA.

In the front emission type structure in which light may be emitted toward the common electrode CME based on the light emitting layer EML, the pixel electrode PXE may be formed of a metal material having high reflectance.

A pixel defining layer PDL may be disposed on the pixel electrode PXE. The pixel defining layer PDL may be disposed on the pixel electrode PXE, and may include an opening exposing the pixel electrode PXE. The pixel defining layer PDL may include an organic insulating material.

The light emitting layer EML may be disposed on the pixel electrode PXE exposed by the pixel defining layer PDL. The light emitting layer EML may include an organic material layer. The organic material layer of the light emitting layer EML may include an organic light emitting layer, and may further include a hole injection/transport layer and/or an electron injection/transport layer. In an embodiment, the light emitting layer EML may have a tandem structure including multiple organic light emitting layers overlapping each other in a thickness direction and a charge generating layer disposed therebetween. Each of the organic light emitting layers disposed to overlap each other may emit light of a same wavelength, but may emit light of different wavelengths. At least some of the organic light emitting layers may be separated from a same layer of a neighboring pixel.

The common electrode CME may be disposed on the light emitting layer EML. The common electrode CME may be a second electrode of the light emitting element EMD, for example, a cathode electrode. The common electrode CME may be formed in common with the pixels. In an embodiment, in the front emission type structure, the common electrode CME may be formed of a transparent metal material (TCO) that can transmit light, or a semi-transmissive conductive material. In the bottom emission type structure, the common electrode CME may be formed of a metal material having high reflectance.

A heat dissipation device HDD may be disposed under the display panel 100. As described above, the heat dissipation device HDD may include a heat dissipation member 200, an air blower 300, a flow path pattern 400, and a porous member 500.

The heat dissipation member 200 may include a material having high thermal conductivity to dissipate heat generated from the display panel 100 and the driving chip 130. For example, the heat dissipation member 200 may include aluminum, graphite, or a combination thereof. The heat dissipation member 200 may have a flat plate shape, but is not limited thereto, and may include a curved surface. The heat dissipation member 200 may contact the back surface of the display panel 100. In the display panel 100, heat may be generated from the display area DA in which pixels may be disposed (e.g., arranged). Therefore, it may be desirable that the heat dissipation member 200 overlaps the display area DA of the display panel, but the invention is not limited thereto.

An end of the heat dissipation member 200 in the second direction DR2 may contact the air blower 300. Another end of the heat dissipation member 200 in the second direction DR2 may contact the porous member 500 and the lower chassis 600. Specifically, a lower surface of an end of the heat dissipation member 200 in the second direction DR2 may contact the porous member 500, and a side surface thereof may contact the lower chassis 600, but the invention is not limited thereto. Further, the flow path pattern 400 may be disposed at a side of the heat dissipation member 200 in the third direction DR3. The heat dissipation member 200 may contact the end of the flow path pattern 400 in the third direction DR3.

The air blower 300 may be disposed at a side of the heat dissipation member 200 in the second direction DR2. Multiple air blowers 300 may be disposed (e.g., provided), and may be arranged at a side of the back surface of the display panel 100 in the second direction DR2. The air blowers 300 may be arranged along the first direction DR1. Each air blower 300 may inject air toward a side of a flow path AP defined by the flow path pattern 400 in the second direction DR2. The air blown by each air blower 300 may be provided from the outside through a first hole 610 provided in the lower chassis 600, which will be described later, and injected into the flow path AP. The air injected into the flow path AP may be discharged to the outside through a second hole 620 provided in the lower chassis 600. A specific shape and operation of the air blower 300 will be described later with reference to FIGS. 8 to 10.

The flow path pattern 400 may be disposed at a side of the heat dissipation member 200 in the third direction DR3 and at a side of the air blower 300 in the second direction DR2. The flow path pattern 400 may have a shape extending in the second direction DR2. Multiple flow path patterns 400 may be provided, and may be arranged spaced apart from each other in the first direction DR1. The space between the mutually adjacent flow path patterns 400 may be a flow path AP. The flow path AP may provide a path through which air passes. The flow path AP may be defined by mutually the adjacent flow path patterns 400, the heat dissipation member 200, and the lower chassis 600. The boundary between the neighboring air blowers 300 may overlap the flow path pattern 400 in the second direction DR2. The flow path pattern 400 may overlap the porous member 500, which will be described later, in the second direction DR2.

A side of the flow path pattern 400 in the third direction DR3 may contact the heat dissipation member 200, and another side thereof may contact the lower chassis 600. The flow path pattern 400 may be formed through exposure and development processes. For example, the flow path pattern 400 may include an organic material, and the organic material may be a photosensitive organic material. The flow path pattern 400 may be formed through exposure and development after applying an organic material layer. The organic material layer may be a negative photosensitive material layer in which a portion irradiated with light may be cured, but the invention is not limited thereto.

The porous member 500 may be disposed to face the air blower 300. In the porous member 500, air having passed through the flow path AP may be introduced from another side of the porous member 500 in the second direction DR2, and may be discharged to a side of the porous member 500 in the second direction DR2. The air discharged from the porous member 500 may be discharged to the outside through the second hole 620 of the lower chassis 600. The porous member 500 may have a shape extending in the first direction DR1. The porous member 500 may include a material having pores through which air passes. For example, the porous member 150 may include oxides, carbides of silicon, titanium, aluminum, zinc, or a combination thereof. Specifically, the porous member 500 may include silicon oxide, titanium oxide, aluminum oxide, zinc oxide, silica, or a combination thereof. In other embodiments, the porous member 500 may include an adhesive material to attach the heat dissipation member 200 and the lower chassis 600 to each other.

A side of the porous member 500 in the second direction DR2 may contact the lower chassis 600, and another side thereof may contact an end of the flow path pattern 400 in the second direction DR2.

The lower chassis 600 may maintain a skeleton of the display device 1, and may provide a space for storing the display panel 100 and the heat dissipation device HDD. For example, the display panel 100 and the heat dissipation device HDD may be accommodated in the inner space of the lower chassis 600. Although not shown, the inner space of the lower chassis 600 may further accommodate at least one of a mold frame, a reflective sheet, and an optical sheet. A side surface of the lower chassis 600 in the second direction DR2 may be spaced apart from the air blower 300. Another side surface of the lower chassis 600 in the second direction DR2 may contact the porous member 500. An adhesive member (not shown) may further be provided between the porous member 500 and a side surface of the lower chassis 600 in the second direction DR2, but the invention is not limited thereto.

The lower chassis 600 may include a first hole 610 and a second hole 620 penetrating a side surface thereof. The first hole 610 may be disposed on a side surface of the lower chassis 600 adjacent to the air blower 300 in the second direction DR2. The first hole 610 may be a hole opened in the second direction DR2 from the lower chassis 600. First holes 610 may be provided, and may be arranged along the first direction DR1. Each first hole 610 may overlap the air blower 300 and the flow path AP in the second direction DR2. Each first hole 610 may be disposed to overlap each air blower 300 and each flow path AP in a one-to-one correspondence, but the invention is not limited thereto, and the first holes 610 may overlap a flow path AP or an air blower 300.

The first hole 610 may be a passage through which air may be supplied from outside of the display device 1 to the air blower 300. For example, air may enter the first hole 610 of the lower chassis 600 and enter the inside of the air blower 300. The flow of air in the air blower 300 will be described later with reference to FIGS. 8 to 10.

The second hole 620 may be disposed on a side surface of the lower chassis 600 adjacent to the porous member 500 in the second direction DR2. The second hole 620 may be disposed to face the first hole 610. The second hole 620 may be a hole opened in the second direction DR2 from the lower chassis 600. Second holes 620 may be provided, and may be arranged along the first direction DR1. Each second hole 620 may overlap the porous member 500 and the flow path AP in the second direction DR2. Each second hole 620 may be disposed to overlap each flow path AP in a one-to-one correspondence, but the invention is not limited thereto, and the second holes 620 may overlap a flow path AP.

The second hole 620 may be a passage through which air may be discharged from the porous member 500 outside the display device 1. For example, air may enter a side surface of the porous member 500 in the second direction DR2 from the flow path AP, and may be discharged to another side surface of the porous member 500 in the second direction DR2. The air discharged to another side surface of the porous member 500 in the second direction DR2 may be discharged outside of the display device 1 through the second hole 620.

The lower chassis 600 may be made of a metal material having rigidity such as stainless steel or a material having good heat dissipation characteristics, such as aluminum or an aluminum alloy. The lower chassis 600 may be formed by a mold press process or the like, but the invention is not limited thereto. The material of the lower chassis 600 may include nonferrous metals except iron and an alloy containing iron as a main component. The lower chassis 600 may include a plastic material (for example, polycarbonate (PC)). Further, the lower chassis 600 may further include glass fiber in addition to the plastic material.

Figure 8:
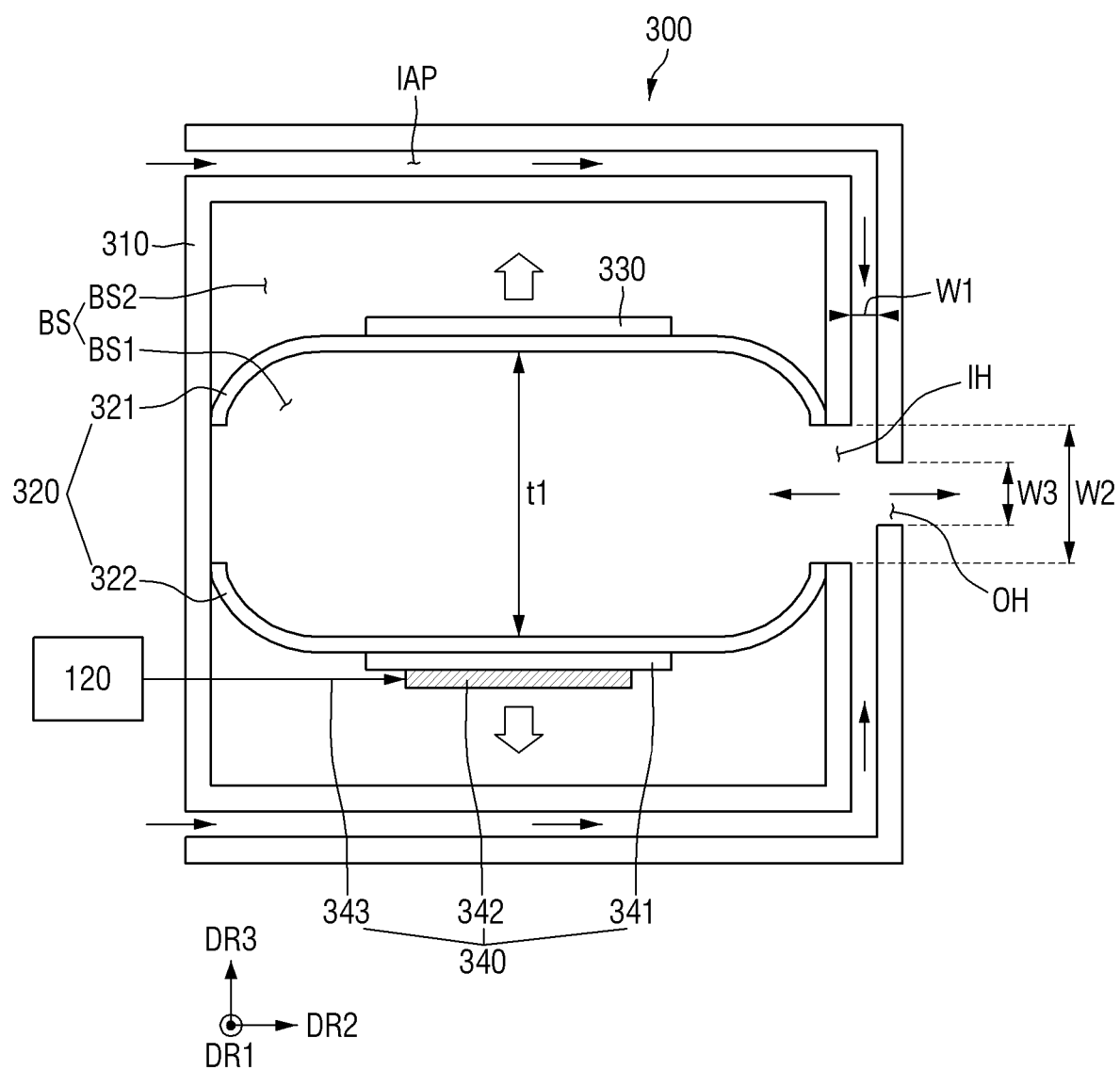
FIG. 8 is a schematic cross-sectional view of an air blower according to an embodiment.
Figure 9:
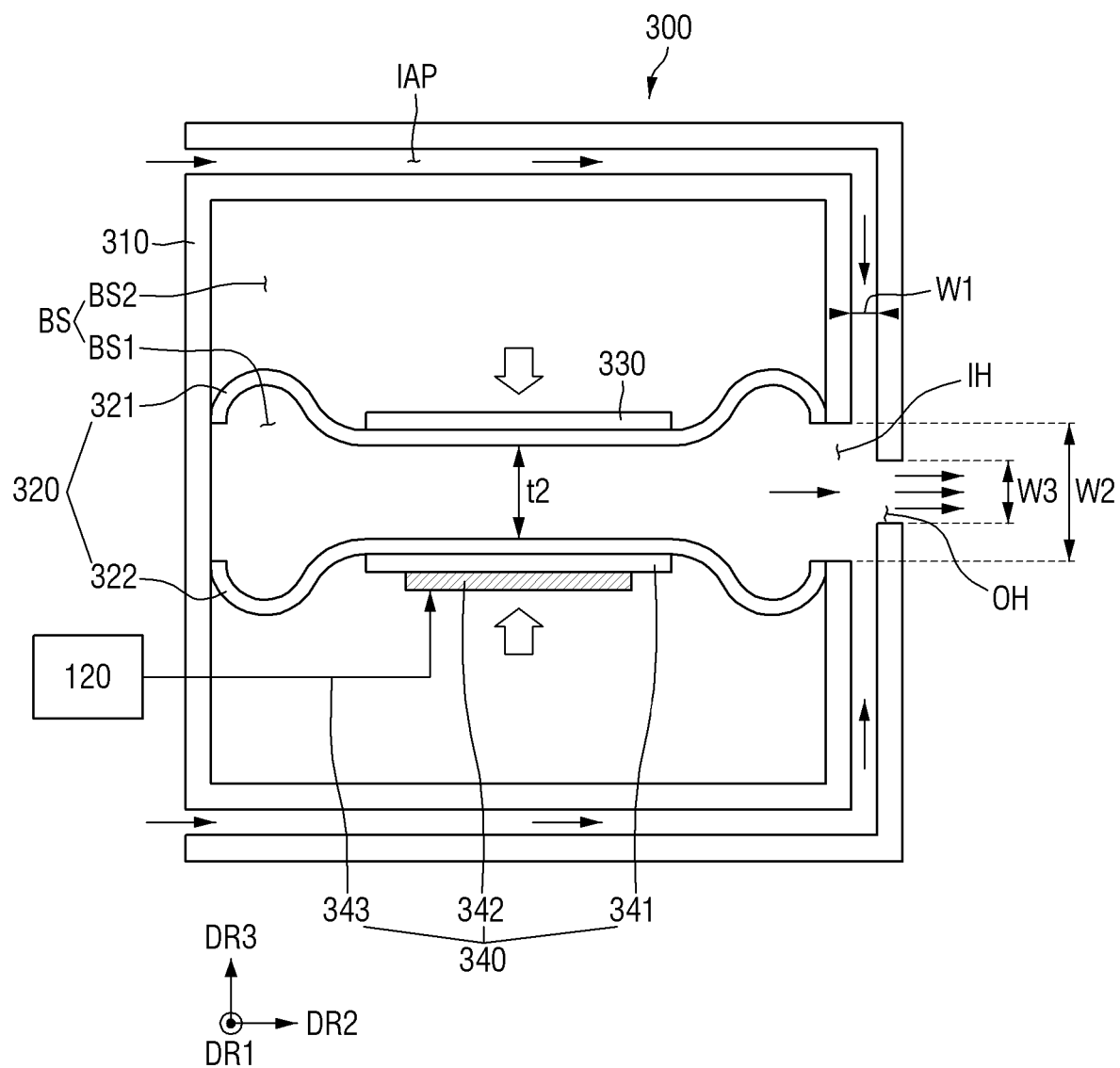
FIG. 9 is a schematic modification example of the air blower of FIG. 8.
Figure 10:
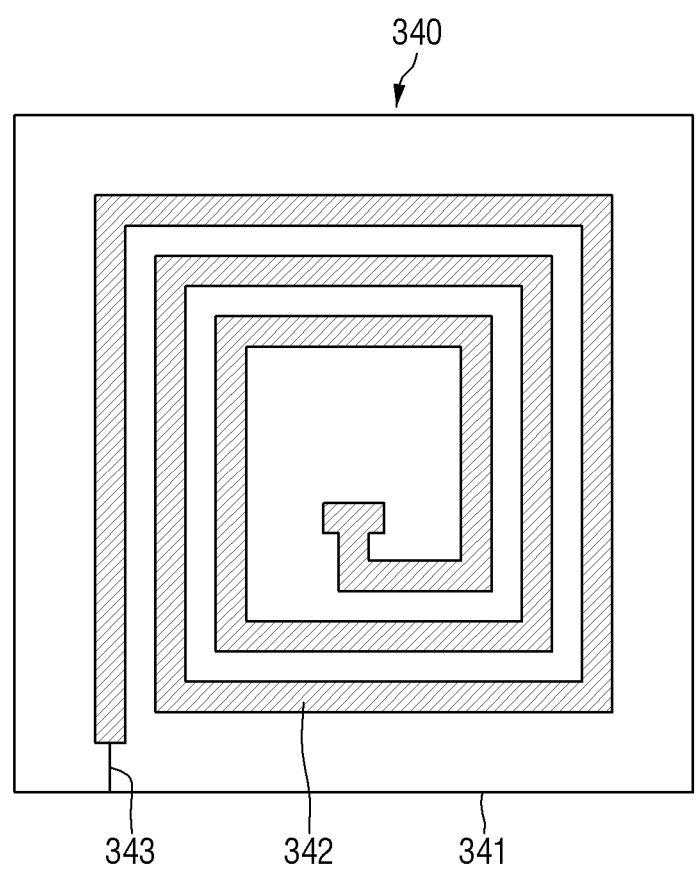
FIG. 10 is a schematic view illustrating a coil according to an embodiment.

FIG. 8 is a cross-sectional view of an air blower according to an embodiment, FIG. 9 is a modification example of the air blower of FIG. 8, and FIG. 10 is a view illustrating a coil according to an embodiment. FIGS. 8 to 10 are views for specifically explaining the internal structure and operation of the aforementioned air blower 300. FIG. 8 is a view showing a state in which the inner space of the air blower 300 may be expanded, and FIG. 9 is a view showing a state in which the inner space of the air blower 300 may be contracted.

Referring to FIGS. 8 to 10, the air blower according to an embodiment may include a body 310, diaphragms 320 coupled to the body 310 and disposed to face each other, and a first magnet 330 and a second magnet 340 coupled to the diaphragms different from each other.

The body 310 may constitute an external frame of the air blower 300. The body 310 may be made of a rigid material. The body 310 may provide an inner space BS in which the diaphragm 320 and the first magnet 330 and second magnet 340 coupled to the different diaphragms 320 may be arranged. As will be described later, the diaphragms 320 may operate in the inner space BS of the air blower 300.

The inner space BS of the air blower 300 may include a first inner space BS1 disposed between the diaphragms 320 facing each other and a second inner space BS2 disposed outside the respective diaphragms 320. The first inner space BS1 may be a space opened by an inner hole IH and an outer hole OH, which will be described later, and the second inner space BS2 may be a closed space.

The body 310 may include an inner flow path IAP disposed inside the sidewall. The inner flow path IAP may provide a passage through which air entering the inside of the display device 1 through the aforementioned first hole 610 may enter the inside of the air blower 300. Although FIGS. 8 and 9 illustrate an inner flow path IAP disposed along a side wall of the body 310 in the third direction DR3 and a side wall of the body 310 in the second direction DR2, and an inner flow path IAP disposed along another side wall of the body 310 in the third direction DR3 and a side wall of the body 310 in the second direction DR2, the invention is not limited thereto. In another embodiment, the inner flow path IAP may be disposed inside the sidewall along a side wall of the body 310 in the first direction DR1 and a side wall of the body 310 in the second direction DR2, and may also be disposed inside the sidewall along another side wall of the body 310 in the first direction DR1 and a side wall of the body 310 in the second direction DR2. The inner flow path IAP may have a first width W1.

An inner hole IH and an outer hole OH may be disposed at a side of the body 310 in the second direction DR2. The inner hole IH may be a hole connecting the first inner space BS1 of the air blower 300 and the inner flow path IAP, and the outer hole OH may be a hole connecting the inner flow path IAP and the flow path AP. Each of the inner hole IH and the outer hole OH may have a circular shape in a cross-sectional view, but is not limited thereto, and may have an elliptical or polygonal shape. In an embodiment, the inner hole IH may have a second width W2, and the outer hole OH may have a third width W3 smaller than the second width W2, but the invention is not limited thereto. In an embodiment, the first width W1 may be smaller than the second width W2 and may be smaller than the third width W3, but the invention is not limited thereto.

The diaphragms 320 may include a first diaphragm 321 disposed at a side in the third direction DR3 and a second diaphragm 322 disposed at another side in the third direction DR3. The diaphragms 320 may be coupled to a side wall and another side wall of the body portion 310 in the second direction DR2. The diaphragms 320 may be attached to the body 310 by an adhesive (not shown), but is not limited thereto, and may also be coupled to the body 310 by ultrasonic bonding or welding.

The diaphragms 320 disposed to face each other may adjust the ratio of the first inner space BS1 and the second inner space BS2 of the air blower 300. For example, in case that the distance between the first diaphragm 321 and the second diaphragm 322 increases, the first inner space BS1 expands, and the second inner space BS2 contracts, so that the proportion of the first inner space BS1 in the inner space BS may increase, and the proportion of the second inner space BS2 in the inner space BS may decrease. FIG. 8 is a view showing a state in which the first inner space BS1 expands and the second inner space BS2 contracts. The interval between the first diaphragm 321 and the second diaphragm 322 may be a first interval t1.

Further, in case that the interval between the first diaphragm 321 and the second diaphragm 322 decreases, the first inner space BS1 contracts, and the second inner space BS2 expands, so that the proportion of the first inner space BS1 in the inner space BS may decrease, and the proportion of the second inner space BS2 in the inner space BS may increase. FIG. 9 is a view showing a state in which the first inner space BS1 contracts and the second inner space BS2 expands. The interval between the first diaphragm 321 and the second diaphragm 322 may be a second interval t2 smaller than the first interval t1.

Even in case that the distance between the first diaphragm 321 and the second diaphragm 322 increases to the maximum to have a first interval t1, the first diaphragm 321 and the second diaphragm 322 may not contact the body 310 of the air blower 300. Therefore, the transmission of vibration generated by the operation of the diaphragm 320 to the display panel 100 may be minimized.

The diaphragm 320 may be an elastic thin film. In an embodiment, the diaphragm 320 may be a vibrating plate that may be repeatedly vibrated by another driving device. The diaphragm 320 may be repeatedly bent to apply pressure to a fluid. For example, the diaphragm 320 may include at least one of natural rubber, synthetic rubber, and a metal plate, but the material thereof is not limited thereto.

First and second magnets 330 and 340 may be disposed on a surface of the diaphragm 320. In an embodiment, the first and second magnets 330 and 340 may be electromagnets. In another embodiment, one of the first and second magnets 330 and 340 may be an electromagnet, and another thereof may be a permanent magnet. Although it is illustrated in FIGS. 8 and 9 that the first magnet 330 may be a permanent magnet and the second magnet 340 may be an electromagnet, but the invention is not limited thereto. Although it is illustrated in FIGS. 8 and 9 that, in the inner space of the air blower 300, the first magnet 330, which may be a permanent magnet, may be located on a side in the third direction DR3, and the second magnet 340, which may be an electromagnet, may be located on another side in the third direction DR3, the position relationship of the first and second magnets 330 and 340 is not limited thereto.

The first magnet 330 may be disposed on a side surface of the first diaphragm 321 in the third direction DR3. The first magnet 330 may be a permanent magnet in which a side and another side thereof in the third direction DR 3 have different poles from each other. For example, a side of the first magnet 330 in the third direction DR3 may have an N pole, and another side thereof may have an S pole. In other embodiments, a side of the first magnet 330 in the third direction DR3 may have an S pole, and another side thereof may have an N pole. Another side surface of the first magnet 330 in the third direction DR3 may be entirely attached to a side surface of the first diaphragm 321 in the third direction DR3. The first magnet 330 and the first diaphragm 321 may be attached to each other by an adhesive (not shown), but the attachment method is not limited thereto.

The second magnet 340 may be disposed on a side surface of the second diaphragm 322 in the third direction DR3. The second magnet 340 may include a base portion 341, a coil electrode 342 disposed on the base portion 341, and a connection line 343 electrically connecting the coil electrode 342 and a power supply.

The base portion 341 may constitute an external frame of the second magnet 340, and may have a rectangular flat plate shape. The planar shape of the base portion 341 and the planar shape of the aforementioned first magnet 330 may be a same shape. The base portion 341 may overlap the first magnet 330 in the third direction DR3.

A side surface of the base portion 341 in the third direction DR3 may be entirely attached to a side surface of the second diaphragm 322 in the third direction DR3. The base portion 341 and the second diaphragm 322 may be attached to each other by an adhesive (not shown), but the attachment method is not limited thereto.

The coil electrode 342 may be disposed on the base portion 341, and may have a spiral structure. FIG. 10 illustrates a coil electrode having a spiral structure in a clockwise direction, but the invention is not limited thereto. In a plan view, the outer shape of the coil electrode 342 may be a rectangle, but is not limited thereto, and the coil electrode 342 may have a circular shape or other polygonal shapes.

When power may be applied to the coil electrode 342, the coil electrode 342 may become an electromagnet having different poles on a side and another side thereof in the third direction DR3 according to Ampere's Law. AC power may be applied to the coil electrode 342. Accordingly, poles on a side and another side of the coil electrode 342 may be periodically changed.

The coil electrode 342 may be patterned on (e.g., directly patterned on) the base portion 341, attached to each other by an adhesive (not shown), or attached to each other by welding, but the invention is not limited thereto.

The AC power applied to the coil electrode 342 may be applied through the connection line 343. An end of the connection line 343 may be electrically connected to the coil electrode 342, and another end thereof may be electrically connected to the printed circuit board 140. As described above, the printed circuit board 140 may provide an AC power to the coil electrode 342, wherein the AC power may be applied through the connection line 343. Further, in case that the display panel 100 may be driven, the connection line 343 may be electrically connected to the printed circuit board 140 to apply AC power. Accordingly, the display panel 100 and the air blower 300 may be driven together. For example, the printed circuit board 140 may serve as a controller controlling the driving of the air blower 300 by controlling the attraction force and repulsive force between the first magnet 330 and the second magnet 340.

Hereinafter, an operation of the air blower 300 will be described by taking the first magnet 330 in which a side thereof in the third direction DR3 has an N pole and another side thereof in the third direction DR3 has an S pole, as an example.

As described above, AC power may be applied to the coil electrode 342 of the second magnet 340. Accordingly, poles (N pole and S pole) formed on a side and another side of the second magnet 340 in the third direction DR3 may be periodically changed.

For example, in case that a side of the second magnet 340 in the third direction DR3 has an S pole, a repulsive force may act between the first magnet 330 and the second magnet 340. The first diaphragm 321 and the second diaphragm 322 may become far away from each other. Air may enter the air blower 300 from outside of the display device 1 through the inner flow path IAP. Specifically, air entering from the outside through the inner flow path IAP may enter the first inner space BS1 through the inner hole IH. The first inner space BS1 may expand, and the second inner space BS2 may contract. The inner pressure in the second inner space BS2 may increase.

In contrast, in case that a side of the second magnet 340 in the third direction DR3 has an N pole, an attractive force may act between the first magnet 330 and the second magnet 340. The first diaphragm 321 and the second diaphragm 322 may become close to each other. Due to the attraction force between the first magnet 330 and the second magnet 340 and the inner pressure in the second inner space BS2, the first inner space BS1 may contract, and the second inner space BS2 may expand. Through this, air may be injected toward the flow path AP through the inner hole IH and the outer hole OH. Since the first width W1 of the inner flow path IAP may be sufficiently smaller than the second width W2 of the inner hole IH and the third width W3 of the outer hole OH, in case that the first inner space BS1 contracts, the amount of air exiting through the internal flow path IAP may be negligible.

In the flow of air in the inner flow path IAP, effective air flow may be directed to the inside of the air blower 300 due to the inertia of the flow of air to the inner space BS1 even in case that the first inner space BS1 contracts. Here, the effective air flow may mean a direction in which air flowing to a side and another side may be canceled to allow air to substantially flow.

Further, in the flow of air in the outer hole OH, effective air flow may be directed to the flow path AP due to the inertia of the flow of air injected toward the flow path AP.

The air injected from the air blower 300 to the flow path AP may improve a heat dissipation effect of the heat dissipation member 200 through convection generated from the air blower 300 toward the porous member 500 on the heat dissipation member 200.

The display device 1 according to an embodiment may include a flow path AP disposed adjacent to the heat dissipation member 200 and an air blower 300 capable of supplying air to the flow path AP. The air blower 300 may include diaphragms 320 disposed to face each other and a first magnet 330 and a second magnet 340 coupled to respective diaphragms 320. AC voltage may be applied to the second magnet 340 of the air blower 300 to repeat the expansion and contraction of the first inner space BS1 of the diaphragms 320 facing each other, thereby injecting air into the flow path AP, and thus the heat dissipation effect of the heat dissipation member 200 may be improved by using a convection phenomenon. Therefore, heat generated in case that the display device 1 may be driven may be effectively dissipated.

Hereinafter, other embodiments of the display device 1 will be described. In the following embodiments, for the same configuration as the already described embodiments, a description thereof will be omitted or simplified, and differences will be described.

Figure 11:
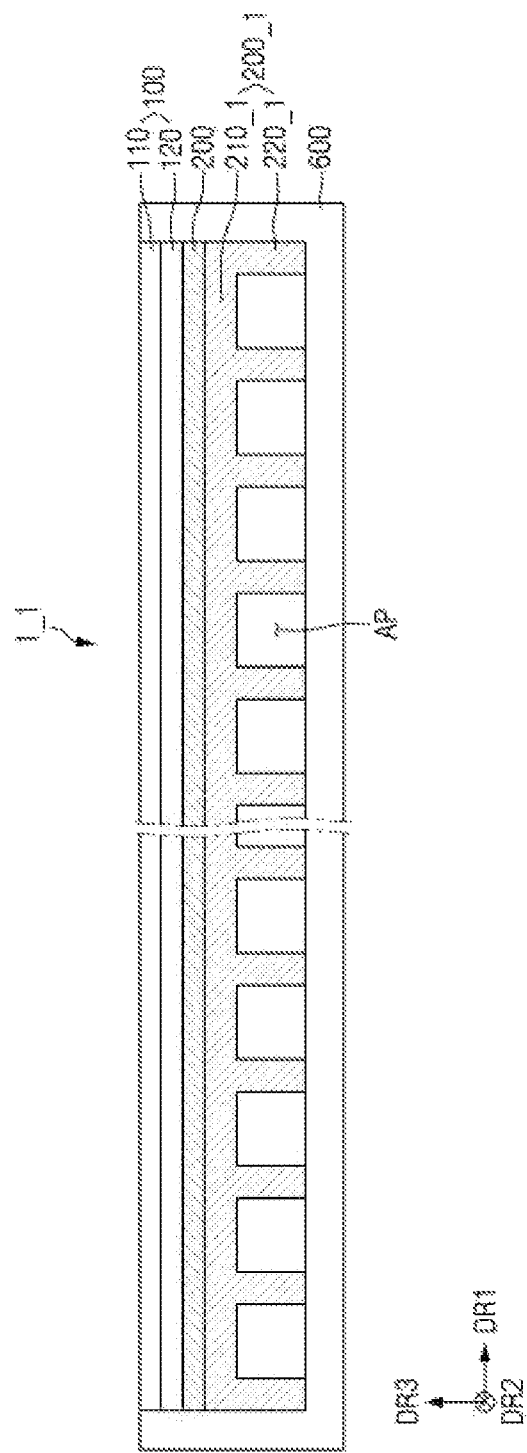
FIG. 11 is a schematic cross-sectional view of a display device according to another embodiment.

FIG. 11 is a cross-sectional view of a display device according to another embodiment.

Referring to FIG. 11, a display device 1_1 according to an embodiment may include a heat dissipation member 200_1 including a flat portion 210_1 and a protrusion portion 220_1 protruding from flat portion 210_1 to another side thereof in the third direction DR3. The protrusion portion 220_1 may have a shape extending in the second direction DR2. The protrusion portion 220_1 may serve as the flow path pattern 400 in the display device 1 according to an embodiment. For example, the protrusion portion 220_1 of the heat dissipation member 200_1 may define a flow path AP.

The display device 1_1 according to an embodiment may include a flow path AP disposed adjacent to the heat dissipation member 200_1 and an air blower 300 capable of supplying air to the flow path AP. The air blower 300 may include diaphragms 320 disposed to face each other and a first magnet 330 and a second magnet 340 coupled to the respective diaphragms 320. AC voltage may be applied to the second magnet 340 of the air blower 300 to repeat the expansion and contraction of the first inner space BS1 of the diaphragms 320 facing each other, thereby injecting air into the flow path AP, and thus the heat dissipation effect of the heat dissipation member 200_1 may be improved by using a convection phenomenon. Therefore, heat generated in case that the display device 1_1 may be driven may be effectively dissipated.

The display device 1_1 according to an embodiment may exhibit an improved heat dissipation effect because the surface area of the heat dissipation member 200_1 exposed to the flow path AP may be larger than that of the display device 1 according to an embodiment. Further, the display device 1_1 according to an embodiment is advantageous in that a manufacturing process may be omitted by introducing the protrusion portion 220_1 of the heat dissipation member 200_1 in place of the flow path pattern 400 included in the display device 1 according to an embodiment.

Figure 12:
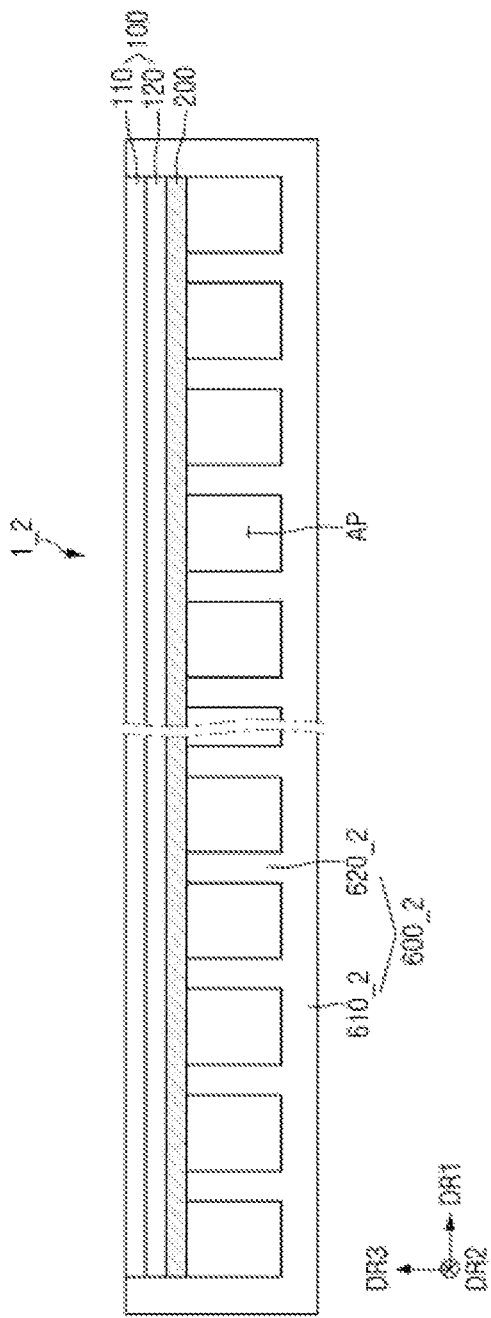
FIG. 12 is a schematic cross-sectional view of a display device according to another embodiment.

FIG. 12 is a cross-sectional view of a display device according to another embodiment.

Referring to FIG. 12, a display device 1_2 according to an embodiment may include a lower chassis 600_2 including a bottom portion 610_2 and a protrusion portion 620_2 protruding from the bottom portion 610_2 to a side thereof in the third direction DR3. The protrusion portion 620_2 may have a shape extending in the second direction DR2. The protrusion portion 620_2 may serve as the flow path pattern 400 in the display device 1 according to an embodiment. For example, the protrusion portion 620_2 of the lower chassis 600_2 may define a flow path AP.

The display device 1_2 according to an embodiment may include a flow path AP disposed adjacent to the heat dissipation member 200 and an air blower 300 capable of supplying air to the flow path AP. The air blower 300 may include diaphragms 320 disposed to face each other and a first magnet 330 and a second magnet 340 coupled to the respective diaphragms 320. AC voltage may be applied to the second magnet 340 of the air blower 300 to repeat the expansion and contraction of the first inner space BS1 of the diaphragms 320 facing each other, thereby injecting air into the flow path AP, and thus the heat dissipation effect of the heat dissipation member 200 may be improved by using a convection phenomenon. Therefore, heat generated in case that the display device 1_2 may be driven may be effectively dissipated.

The display device 1_2 according to an embodiment is advantageous in that the manufacturing process may be omitted by introducing the protrusion portion 620_2 of the lower chassis 600_2 in place of the flow path pattern 400 included in the display device 1 according to an embodiment.

Figure 13:
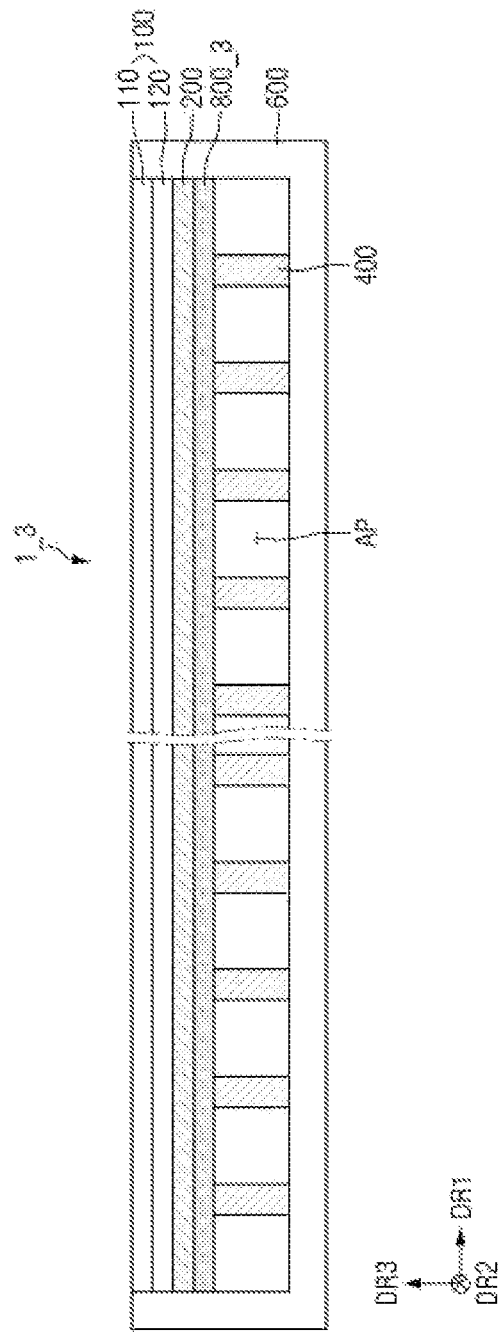
FIG. 13 is a schematic cross-sectional view of a display device according to another embodiment.

FIG. 13 is a cross-sectional view of a display device according to another embodiment.

Referring to FIG. 13, a display device 1_3 according to an embodiment may include a first heat dissipation member 200 and a second heat dissipation member 800_3 disposed between the first heat dissipation member 200 and the flow path pattern 400. In an embodiment, a side surface of the second heat dissipation member 800_3 in the third direction DR3 may include a nano-pattern structure, and thus the surface area of the surface exposed to the flow path AP may be large. The nano-pattern structure may mean a pattern structure including protrusions having a size of several nano to tens of nano units. In another embodiment, the second heat dissipation member 800_3 may have higher thermal conductivity than the first heat dissipation member 200.

The second heat dissipation member 800_3 may be disposed on the first heat dissipation member 200. A side surface of the second heat dissipation member 800_3 in the third direction DR3 may contact a side surface of the first heat dissipation member 200 in the third direction DR3. An adhesive layer (not shown) may be disposed between the first heat dissipation member 200 and the second heat dissipation member 800_3 to attach the first heat dissipation member 200 and the second heat dissipation member 800_3 to each other, but the invention is not limited thereto, and the first heat dissipation member 200 and the second heat dissipation member 800_3 may be attached to each other by a method such as ultrasonic bonding or welding.

The display device 1_3 according to an embodiment may include a flow path AP disposed adjacent to the heat dissipation member 200 and an air blower 300 capable of supplying air to the flow path AP. The air blower 300 may include diaphragms 320 disposed to face each other and a first magnet 330 and a second magnet 340 coupled to the respective diaphragms 320. AC voltage may be applied to the second magnet 340 of the air blower 300 to repeat the expansion and contraction of the first inner space BS1 of the diaphragms 320 facing each other, thereby injecting air into the flow path AP, and thus the heat dissipation effect of the heat dissipation member 200 may be improved by using a convection phenomenon. Therefore, heat generated in case that the display device 1_3 may be driven may be effectively dissipated.

In the display device 1_3 according to an embodiment, due to the second heat dissipation member 800_3 having a nano-pattern, the surface area of the surface exposed to the flow path AP may be large, and an improved heat dissipation effect may be exhibited, as compared with the display device 1 according to an embodiment.

The effects of the embodiments are not limited by the foregoing, and other various effects are anticipated herein.

Although embodiments of the invention have been disclosed for illustrative purposes, those skilled in the art will appreciate that various modifications, additions and substitutions are possible, without departing from the scope and spirit of the invention as disclosed in the accompanying claims and their equivalents.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device, comprising:
   a first heat dissipation member disposed on a lower surface of a display panel; and
   an air generator disposed on a lower surface of the first heat dissipation member, wherein
   the air generator includes:
      an air blower; and
         an air flow path disposed at a side of the air blower and extending in a first direction, the air blower includes:
      a body defining an inner space of the air blower;
      a first diaphragm and a second diaphragm disposed in the inner space of the body, the first diaphragm and the second diaphragm facing each other;
      a first magnet disposed on a surface of the first diaphragm;
      a second magnet disposed on a surface of the second diaphragm; and
      an air discharge hole of the body disposed between the first diaphragm and the second diaphragm, the air discharge hole opened toward the air path, and
   at least one of the first magnet and the second magnet is an electromagnet.

2. The display device of claim 1, wherein the air blower is disposed in plurality, and the plurality of air blowers are arranged in a second direction intersecting the first direction.

3. The display device of claim 1, wherein a surface of the first magnet and a surface of the second magnet face each other.

4. The display device of claim 3, wherein the first magnet is a permanent magnet, and the second magnet is an electromagnet.

5. The display device of claim 4, wherein alternating current power is applied to the second magnet.

6. The display device of claim 5, wherein attractive force and repulsive force are periodically changed and applied between the first magnet and the second magnet.

7. The display device of claim 1, further comprising:
   a second heat dissipation member disposed on the lower surface of the first heat dissipation member.

8. The display device of claim 7, wherein a surface of the second heat dissipation member includes a nano-pattern.

9. The display device of claim 7, wherein the second heat dissipation member has a thermal conductivity higher than a thermal conductivity of the first heat dissipation member.

10. The display device of claim 1, wherein the first heat dissipation member includes protrusion portions protruding toward an opposite side of the display panel, having a shape extending in the first direction, and arranged in a second direction intersecting the first direction.

11. The display device of claim 1, further comprising:
a lower chassis providing a space that accommodates the display panel, the first heat dissipation member, and the air blower.

12. The display device of claim 11, wherein the lower chassis includes protrusion portions protruding toward the display panel, having a shape extending in the first direction, and arranged in a second direction intersecting the first direction.

13. The display device of claim 1, wherein
the body includes an inner flow path, and
the inner flow path provides a passage for supplying air to the air blower from outside of the air blower.

14. The display device of claim 13, wherein the air discharge hole includes:
a first hole having a first width; and
a second hole disposed at a side of the first hole in the first direction and having a second width smaller than the first width.

15. A display device, comprising:
a heat dissipation member disposed on a lower surface of a display panel; and
an air generator disposed on a lower surface of the heat dissipation member, wherein the air generator includes:
an air blower; and
an air flow path disposed at a side of the air blower and extending in a first direction, the air blower includes:
a first magnet and a second magnet which face each other;
a controller controlling attractive force and repulsive force of the first magnet and the second magnet; and
an air discharge hole connecting a space between the first magnet and the second magnet to the air flow path.

16. The display device of claim 15, wherein the first magnet is a permanent magnet, and the second magnet is an electromagnet.

17. The display device of claim 16, wherein alternating current power is applied to the second magnet.

18. The display device of claim 15, wherein the heat dissipation member includes:
protrusion portions protruding toward an opposite side of the display panel, having a shape extending in the first direction, and arranged in a second direction intersecting the first direction.

19. The display device of claim 15, further comprising:
a lower chassis providing a space that accommodates the display panel, the heat dissipation member, and the air blower,
wherein the lower chassis includes protrusion portions protruding toward the display panel, having a shape extending in the first direction, and arranged in a second direction intersecting the first direction.

* * * * *